United States Patent
Fain et al.

(10) Patent No.: US 10,325,828 B2
(45) Date of Patent: Jun. 18, 2019

(54) ELECTRONICS PACKAGE WITH IMPROVED THERMAL PERFORMANCE

(71) Applicant: Qorvo US, Inc., Greensboro, NC (US)

(72) Inventors: Jonathan J. Fain, Sachse, TX (US); Mark C. Woods, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 31 days.

(21) Appl. No.: 15/472,678

(22) Filed: Mar. 29, 2017

(65) Prior Publication Data

US 2017/0287807 A1 Oct. 5, 2017

Related U.S. Application Data

(60) Provisional application No. 62/315,397, filed on Mar. 30, 2016.

(51) Int. Cl.
```
H01L 23/36      (2006.01)
H01L 23/367     (2006.01)
H01L 23/498     (2006.01)
H01L 23/13      (2006.01)
H01L 23/055     (2006.01)
```
(Continued)

(52) U.S. Cl.
CPC ........ *H01L 23/3675* (2013.01); *H01L 23/055* (2013.01); *H01L 23/10* (2013.01); *H01L 23/13* (2013.01); *H01L 23/49838* (2013.01); *H01L 25/0655* (2013.01); *H01L 23/49827* (2013.01); *H01L 24/16* (2013.01); *H01L 24/32* (2013.01); *H01L 2224/131* (2013.01); *H01L 2224/13023* (2013.01); *H01L 2224/13147* (2013.01); *H01L 2224/16113* (2013.01); *H01L 2224/16235* (2013.01); *H01L 2224/16238* (2013.01); *H01L 2224/32245* (2013.01); *H01L 2224/73204* (2013.01); *H01L 2224/73253* (2013.01); *H01L 2924/16152* (2013.01); *H01L 2924/16195* (2013.01); *H05K 1/141* (2013.01); *H05K 2201/10378* (2013.01)

(58) Field of Classification Search
CPC ... H01L 23/3675; H01L 23/055; H01L 24/17; H01L 25/0655
See application file for complete search history.

(56) References Cited

U.S. PATENT DOCUMENTS 6,156,980 A * 12/2000 Peugh ................ H01L 23/3677
                                                    174/252
6,578,754 B1 * 6/2003 Tung ..................... H01L 24/11
                                                    228/123.1

(Continued)

OTHER PUBLICATIONS

Author Unknown, "Flip Chip BGA," Sep. 2014, accessed Mar. 11, 2016, http://www.statschippac.com/documentlibrary/fcBGA.pdf, STATS ChipPAC Ltd., 2 pages.

(Continued)

*Primary Examiner* — Nicholas J Tobergte
(74) *Attorney, Agent, or Firm* — Withrow & Terranova, P.L.L.C.

(57) ABSTRACT

An electronics package includes a thermal lid over a flip chip component such that the thermal lid is in contact with a surface of a flip chip component and one or more thermal vias in a substrate on which the flip chip component is mounted. The thermal lid dissipates heat from the flip chip component by way of the thermal vias to improve the thermal performance of the electronics package.

20 Claims, 10 Drawing Sheets

(51) Int. Cl.
*H01L 25/065* (2006.01)
*H01L 23/10* (2006.01)
*H05K 1/14* (2006.01)
*H01L 23/00* (2006.01)

(56) References Cited

U.S. PATENT DOCUMENTS

| | | | | |
|---|---|---|---|---|
| 7,696,619 B2* | 4/2010 | Webster | ............... | H01L 23/13 |
| | | | | 257/686 |
| 2004/0188831 A1* | 9/2004 | Hsiao | ............... | H01L 23/10 |
| | | | | 257/719 |
| 2004/0238944 A1* | 12/2004 | Bish | ............... | H01L 23/10 |
| | | | | 257/706 |
| 2005/0250252 A1* | 11/2005 | Li | ............... | H01L 23/04 |
| | | | | 438/123 |
| 2006/0012035 A1* | 1/2006 | Fernandez | ............... | H01L 21/565 |
| | | | | 257/723 |
| 2006/0038281 A1* | 2/2006 | Colgan | ............... | H01L 25/0655 |
| | | | | 257/706 |
| 2006/0223313 A1* | 10/2006 | Yoon | ............... | H01L 24/11 |
| | | | | 438/687 |
| 2008/0150065 A1* | 6/2008 | Oda | ............... | H01L 31/0203 |
| | | | | 257/434 |
| 2009/0045503 A1* | 2/2009 | Koduri | ............... | H01L 23/3675 |
| | | | | 257/693 |
| 2009/0257196 A1* | 10/2009 | Faoro | ............... | H01L 23/10 |
| | | | | 361/719 |
| 2011/0186998 A1* | 8/2011 | Wu | ............... | H01L 21/486 |
| | | | | 257/738 |
| 2012/0146207 A1* | 6/2012 | Chou | ............... | H01L 23/3675 |
| | | | | 257/690 |
| 2012/0319264 A1* | 12/2012 | Fukuda | ............... | H01L 21/561 |
| | | | | 257/690 |
| 2013/0241039 A1* | 9/2013 | Choi | ............... | H01L 21/50 |
| | | | | 257/659 |
| 2015/0303174 A1* | 10/2015 | Yu | ............... | H01L 25/0657 |
| | | | | 257/712 |
| 2016/0225742 A1* | 8/2016 | Davis | ............... | H01L 25/0655 |

OTHER PUBLICATIONS

Chong, Desmond Y.R. et al., "Development of a New Improved High Performance Flip Chip BGA Package," 2004 Electronic Components and Technology Conference, Jun. 4, 2004, Las Vegas, NV, USA, IEEE, pp. 1174-1180.

* cited by examiner

ELECTRONICS PACKAGE WITH IMPROVED THERMAL PERFORMANCE

RELATED APPLICATIONS

This application claims the benefit of provisional patent application Ser. No. 62/315,397, filed Mar. 30, 2016, the disclosure of which is hereby incorporated herein by reference in its entirety.

FIELD OF THE DISCLOSURE

The present disclosure relates to electronics packages, and in particular to electronics packages for flip chip components with improved thermal performance.

BACKGROUND

Electronics packages provide support, protection, and desired connections for one or more electronic components therein. Often, electronics packages dictate certain performance parameters, such as thermal performance, of the electronic components therein. For electronics components with high power handling and dissipation, thermal performance may be a determining factor in the overall performance thereof. For example, the gain of radio frequency (RF) power amplifiers and low-noise amplifiers may be limited by the thermal performance thereof. Accordingly, electronics packages have been designed in an effort to increase thermal performance by allowing heat dissipation in one form or another from the electronics components therein.

As an example, electronics packages for high-power wire bond components often include a heat spreader on which a wire bond component is attached. The heat spreader is often coupled to a corresponding heat sink body or group of thermal vias in a printed circuit board (PCB) in order to dissipate heat from the wire bond component. However, these electronic packages are not compatible with high power flip chip components. In general, electronics packages for flip chip components have struggled to provide an adequate thermal management solution due to the way that these components connect to a substrate, often forcing electronics packages for flip chip components to rely on convection and/or external heat sinks mounted above the electronics package to provide adequate thermal performance.

In light of the above, there is a present need for electronics packages for high power flip chip components with improved thermal performance.

SUMMARY

In one embodiment, an electronics package includes a substrate, a first set of electronic contact pads, a first set of thermal contact pads, a second set of electronic contact pads, a second set of thermal contact pads, a number of thermal vias in the substrate, a flip chip component, and a thermal lid. The first set of electronic contact pads and the first set of thermal contact pads are on a first surface of the substrate. The second set of electronic contact pads and the second set of thermal contact pads are on a second surface of the substrate, which is opposite the first surface. The thermal vias each connect one or more of the first set of thermal contact pads to one or more of the second set of thermal contact pads. The flip chip component is coupled to the substrate via at least a portion of the first set of electronic contact pads. The thermal lid is over the flip chip component such that the thermal lid is in contact with a surface of the flip chip component opposite the substrate and the thermal lid is coupled to at least a portion of the first set of thermal contact pads. By providing the thermal lid such that it is in contact with the flip chip component and the thermal vias in the substrate, heat may be dissipated down towards the substrate through the second surface thereof. Accordingly, the thermal performance of the electronics package may be improved.

In one embodiment, an apparatus includes a printed circuit board (PCB), a number of PCB electronic contact pads, a heat spreader, and an electronics package. The PCB electronic contact pads and the heat spreader are on a surface of the PCB. The electronics package (EP) includes a substrate, a first set of EP electronic contact pads, a first set of thermal contact pads, a second set of EP electronic contact pads, a second set of thermal contact pads, a number of thermal vias in the substrate, a flip chip component, and a thermal lid. The first set of EP electronic contact pads and the first set of thermal contact pads are on a first surface of the substrate. The second set of EP electronic contact pads and the second set of thermal contact pads are on a second surface of the substrate, which is opposite the first surface, and are coupled to the PCB electronic contact pads and the PCB heat spreader, respectively. The thermal vias each connect one or more of the first set of thermal contact pads to one or more of the second set of thermal contact pads. The flip chip component is coupled to the substrate via the first set of EP electronic contact pads. The thermal lid is over the flip chip component such that the thermal lid is in contact with a surface of the flip chip component opposite the substrate and the thermal lid is coupled to at least a portion of the first set of thermal contact pads. By providing the thermal lid such that it is in contact with the flip chip component and the thermal vias in the substrate and ultimately the heat spreader on the PCB, heat may be dissipated down towards the substrate and out by way of the heat spreader of the PCB. Accordingly, the thermal performance of the electronics package may be improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
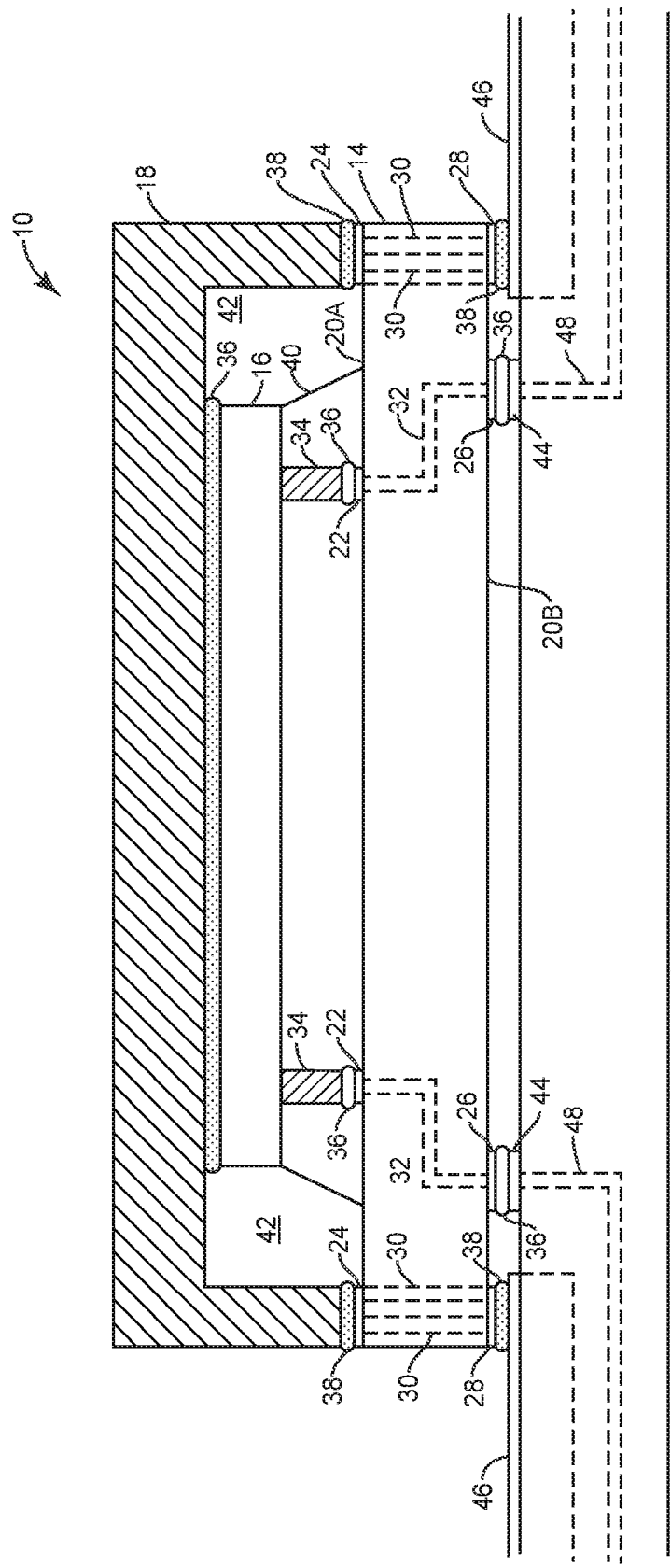
FIG. 1 is a cross-sectional view of an electronics package according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-section of an electronics package 10 according to one embodiment of the present disclosure. For context, a printed circuit board (PCB) 12 on which the electronics package 10 is provided is also shown. The electronics package 10 includes a substrate 14, a flip chip electronic component (EC) 16, and a thermal lid 18. The substrate 14 includes a first surface 20A on which the flip chip EC 16 is mounted and a second surface 20B opposite the first surface 20A. A first set of EC electrical contact pads 22 are on the first surface 20A of the substrate 14 along with a first set of thermal contact pads 24. Note that the contact pads 22 need not always be square in shape, these could be circular, octagonal or of other suitable shapes as well. Note further that the thermal contacts contacting the lid need not be located at the periphery of the package. A second set of EC electrical contact pads 26 are on the second surface 20B of the substrate 14 along with a second set of thermal contact pads 28. A number of thermal vias 30 are provided through the substrate 14 to connect one or more of the first set of thermal contact pads 24 with one or more of the second set of thermal contact pads 28. Generally, the first set of EC electrical contact pads 22 correspond with a layout of the flip chip EC 16 while the second set of EC electrical contact pads 26 correspond with a pattern of corresponding contacts on the PCB 12. A number of metallization layers 32 in the substrate 14, which may include any number of vias and routing layers, couple one or more of the first set of EC electrical contact pads 22 with one or more of the second set of EC electrical contact pads 26.

The thermal vias 30 are provided to move heat from the first set of thermal contact pads 24 to the second set of thermal contact pads 28. Accordingly, the thermal vias 30 may be formed of any material suitable for doing so, such as plated copper, thermally conductive epoxy and the like. The metallization layers 32 are provided to electrically connect the first set of EC electrical contact pads 22 and the second set of EC electrical contact pads 26. Accordingly, the metallization layers 32 may be formed of any material suitable for doing so, such as copper. In some embodiments, the thermal vias 30 may be thicker than the metallization layers 32 due to the different functions thereof. However, the thermal vias 30 may be provided by conventional via processes and thus may be relatively easy to manufacture.

The flip chip EC 16 is mounted to the first surface 20A of the substrate 14 by one or more copper pillars 34 that connect to one or more of the first set of EC electrical contact pads 22, for example, via a solder joint 36. The thermal lid 18 is provided over the flip chip EC 16 such that the thermal lid 18 contacts a surface of the flip chip EC 16 opposite the substrate 14, which is the backside of the flip chip EC 16, and is coupled to the first set of thermal contact pads 24. Specifically, the thermal lid 18 is coupled to the backside of the flip chip EC 16 and the first set of thermal contact pads 24 via a thermal joint 38. In one embodiment, the thermal joint 38 comprises a thermal epoxy. In another embodiment, the thermal joint 38 comprises a sintered material. An underfill material 40 may be provided between the substrate 14 and the flip chip EC 16 in order to provide additional structural stability to the electronics package 10. The underfill material 40 may comprise any suitable material, such as a capillary dispense material, a mold compound that doubles up as an underfill, or other suitable materials.

The thermal lid 18, which need not be rectangular in shape, may be either completely or partially open on one, two, or more sides; conversely the cavity formed by the lid recess and the laminate may completely enclose the flip chip EC 16. In any of these configurations, a cavity 42 is formed by the thermal lid 18 in which the flip chip EC 16 is provided. The cavity 42 may vary in size and shape to accommodate the flip chip EC 16 and any other desired components or space. In one embodiment, the cavity 42 is filled with an encapsulant such as an epoxy to provide additional structural support to the electronics package 10.

Together, the substrate 14, the flip chip EC 16, and the thermal lid 18 comprise the electronics package 10. As will be appreciated by those skilled in the art, such an electronics package 10 is generally provided as part of a larger system, for example, by connecting the electronics package 10 to the PCB 12. As shown, the second set of EC electrical contact pads 26 and the second set of thermal contact pads 28 are thus connected to corresponding PCB electronic contact pads 44 and a corresponding heat spreader 46, respectively, which are located on a surface of the PCB 12. In one embodiment, the heat spreader 42 spans out over an area of the surface of the PCB 12 in order to dissipate heat from the flip chip EC 16 over a relatively large distance. In another embodiment, the heat spreader 46 is embedded in the surface of the PCB 12 in order to provide additional thermal mass for heat dissipation. The PCB electronic contact pads 44 may be connected to various other components on the PCB 12, for example, by a PCB metallization layer 48.

By providing the thermal lid 18 as shown and thermally coupling the thermal lid 18 to a heat spreader on the PCB 12, heat may be directed downwards away from the flip chip EC 16 and towards the PCB 12 where it may be effectively dissipated. Accordingly, the thermal performance of the electronics package 10 may be improved.

Those skilled in the art will appreciate that while only one flip chip EC 16 is shown for purposes of illustration, the electronics package 10 may include any number of electronic components, flip chip or otherwise, without departing from the principles of the present disclosure. For example, in addition to the flip chip EC 16, the electronics package 10 may include one or more passive components such as resistors, capacitors, inductors, and the like, and could also include other die in wire-bond configuration. Those skilled in the art will also appreciate that the vias and routes shown in the PCB 12 and the substrate 14 are shown in an idealized fashion for purposes of illustration. That is, those skilled in the art will appreciate that the thermal vias 30, the metallization layer 32, and the PCB metallization layer 48 may be provided in many different shapes, sizes, and appearances depending on the technology used, all of which are contemplated herein.

In one embodiment, the flip chip EC 16 is a radio frequency (RF) component such as a power amplifier or a low-noise amplifier. Those skilled in the art will readily appreciate that the gain of these components is directly related to the thermal performance thereof. That is, the gain of an RF power amplifier or low-noise amplifier may be limited by the temperature thereof. In various embodiments, the power dissipation of these components may thus be limited by the amount of heat that can be dissipated by the electronics package in which they are provided. To compensate for this, many RF components are operated in a "pulsed" mode where they are rapidly turned on and off to prevent heat buildup. The electronics packaging 10 may alleviate this requirement, allowing for a pulsed mode operation with longer duty-cycles, or even support a steady-state operation of the flip chip EC 16 with desirable thermal performance.

Figure 2A:
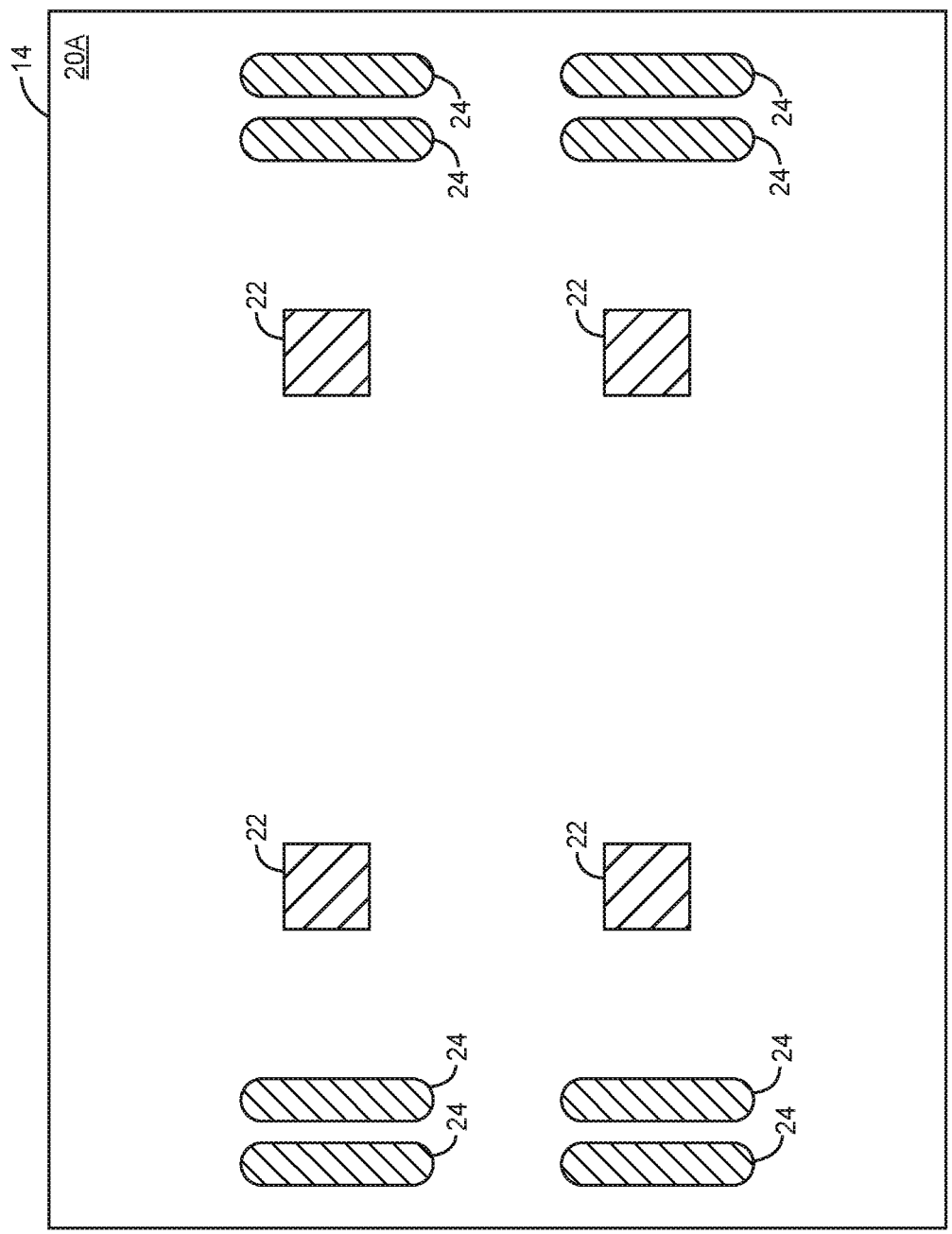
FIGS. 2A through 2C show top views of a substrate for an electronics package according to various embodiments of the present disclosure.
Figure 2B:
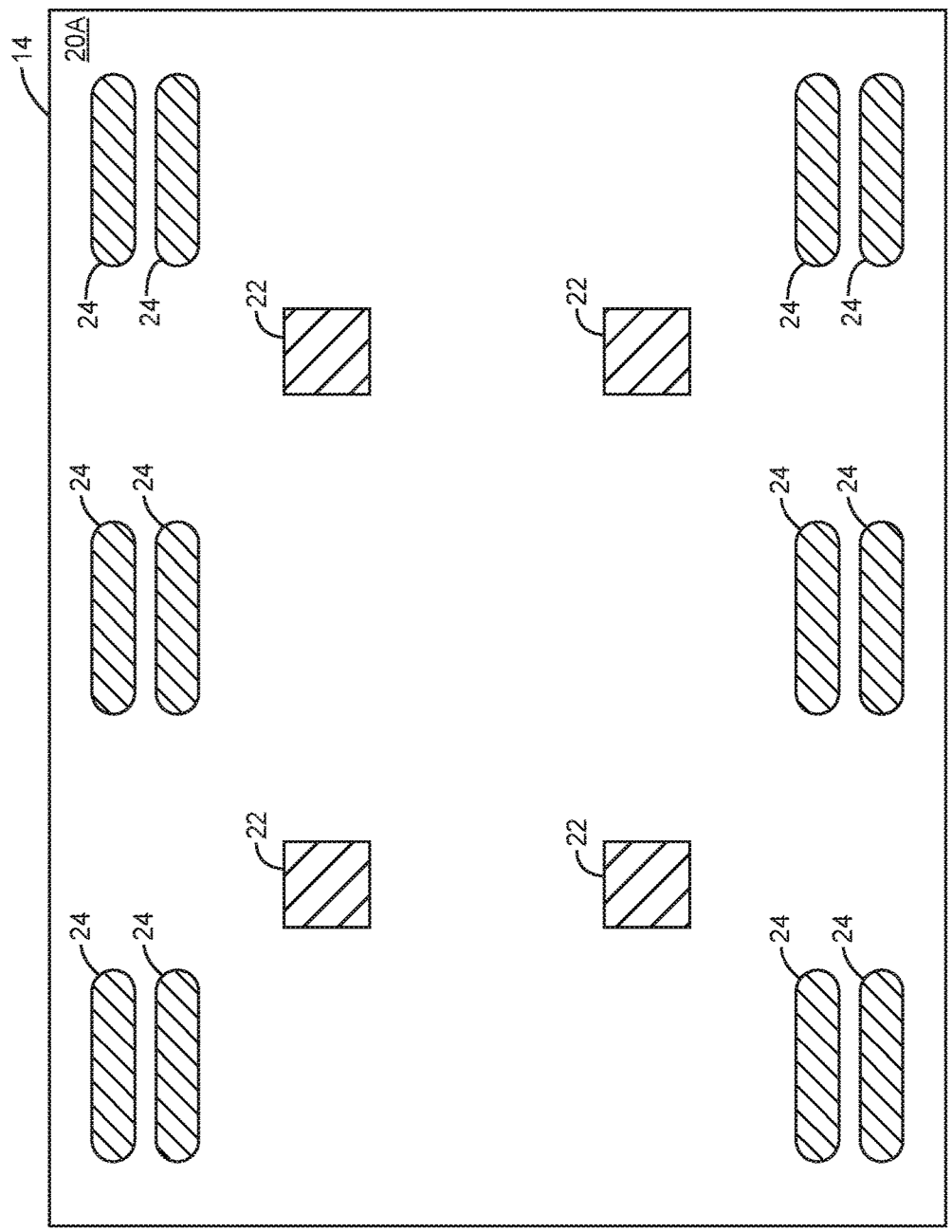
Figure 2C:
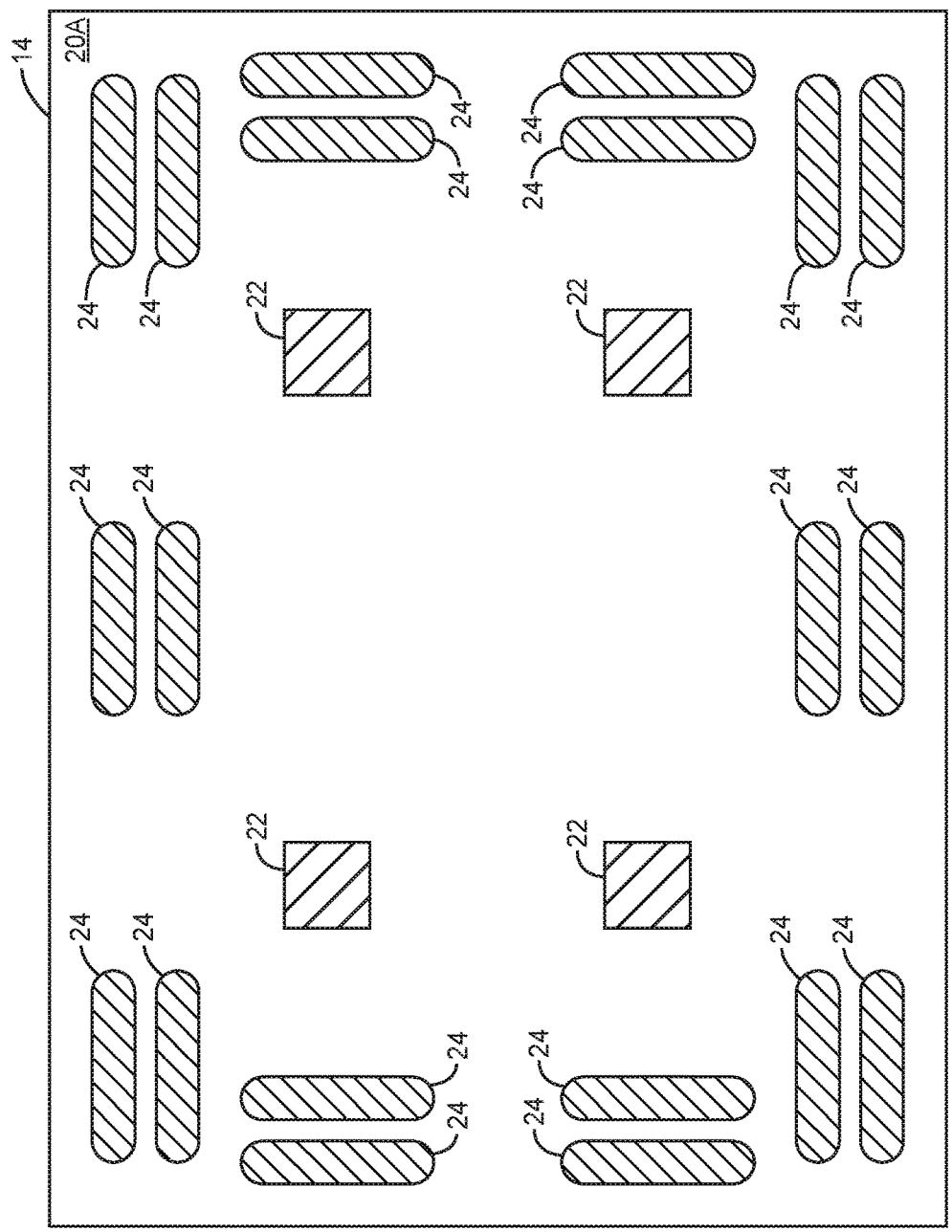

FIGS. 2A through 2C show a top view of the first surface 20A of the substrate 14 according to various embodiments of the present disclosure. Specifically, FIGS. 2A through 2C show various configurations for the thermal contact pads 24 on the first surface 20A of the substrate 14. The first set of EC electrical contact pads 22 are also shown for context. In FIG. 2A, the thermal contact pads 24 are provided such that the thermal lid 18 is coupled to the substrate 14 on a left and right side of the flip chip EC 16. In such an embodiment, a front and back side of the flip chip EC 16 will not be enclosed by the thermal lid 18. FIG. 2B shows the thermal contact pads 24 on a front and back side of the flip chip EC 16. In such an embodiment, a left and right side of the flip chip EC 16 will not be enclosed by the thermal lid 18. FIG. 2C shows the thermal contact pads 24 surrounding the flip chip EC 16. In such an embodiment, the flip chip EC 16 is enclosed by the thermal lid 18. Those skilled in the art will appreciate that the configurations of the first set of thermal contact pads 24 and the first set of EC electrical contact pads 22 discussed above are merely exemplary. That is, the first set of thermal contact pads 24 and the first set of EC electrical contact pads 22 may be provided in any suitable pattern without departing from the principles of the present disclosure.

Figure 3:
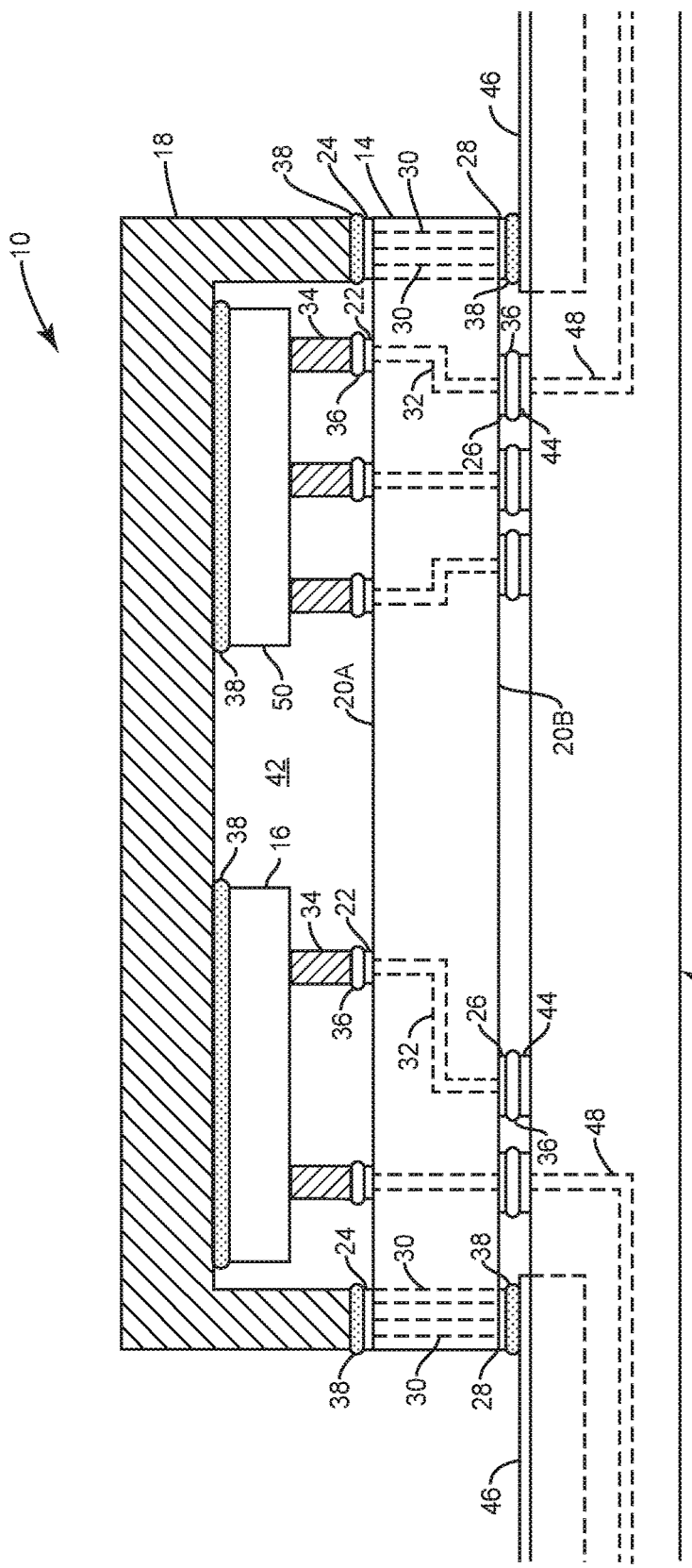
FIG. 3 is a cross-sectional view of an electronics package according to one embodiment of the present disclosure.

FIG. 3 shows the electronics package 10 according to an additional embodiment of the present disclosure. The electronics package 10 shown in FIG. 3 is similar to that shown above in FIG. 1, except that the electronics package 10 in FIG. 3 includes an additional flip chip EC 50. The additional flip chip EC 50 is similarly mounted to a portion of the first set of EC electrical contact pads 22 and located under the thermal lid 18. Additional vias and routes in the metallization layers 32 connect to additional ones of the second set of EC electrical contact pads 26 and additional PCB electrical contact pads 44. Notably, both the flip chip EC 16 and the additional flip chip EC 50 are both under the same thermal lid 18 in this embodiment.

Figure 4:
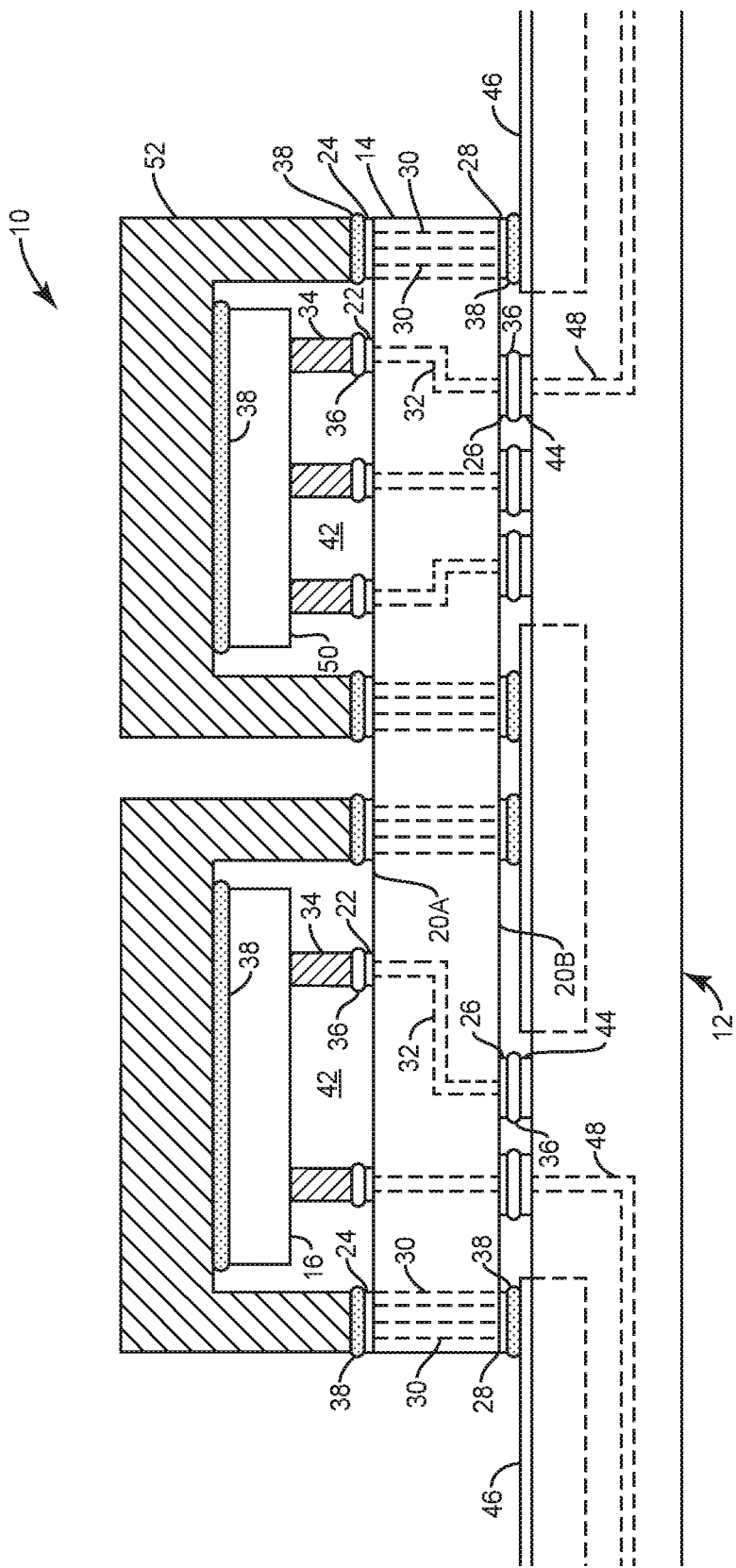
FIG. 4 is a cross-sectional view of an electronics package according to one embodiment of the present disclosure.

FIG. 4 shows the electronics package 10 according to an additional embodiment of the present disclosure. The electronics package 10 shown in FIG. 4 is similar to that shown in FIG. 3, except that the electronics package in FIG. 4 includes an additional thermal lid 52. The additional thermal lid 52 is over the additional flip chip EC 50 as shown. Additional thermal vias 30 are provided in the substrate 14 to connect the thermal lid 18 and the additional thermal lid 52 to the heat spreader 46 on the PCB 12.

Figure 5:
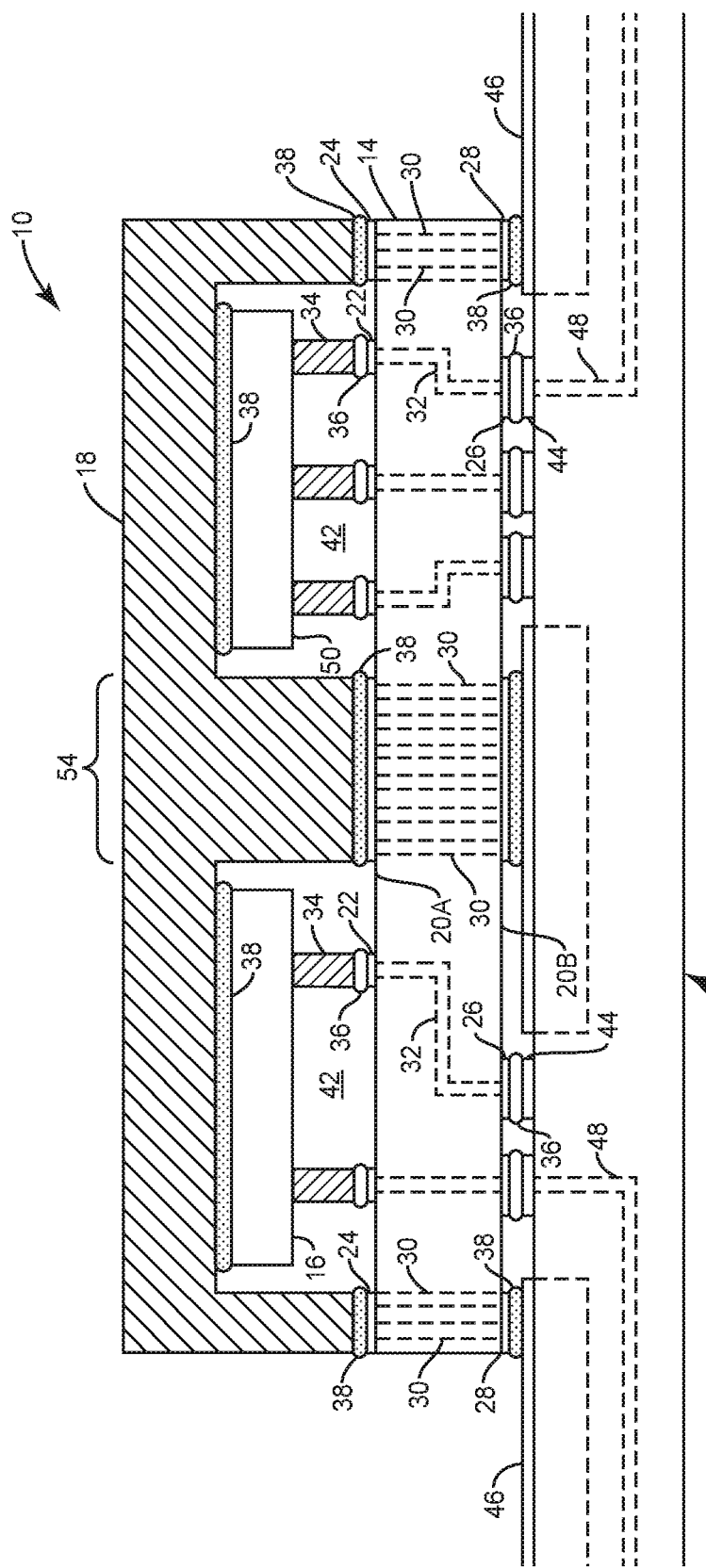
FIG. 5 is a cross-sectional view of an electronics package according to one embodiment of the present disclosure.

FIG. 5 shows the electronics package 10 according to an additional embodiment of the present disclosure. The electronics package 10 shown in FIG. 5 is similar to that shown in FIGS. 3 and 4, except that the thermal lid 18 both covers and separates the flip chip EC 16 and the additional flip chip EC 50 such that a divider column 54 is provided between the flip chip EC 16 and the additional flip chip EC 50. The divider column 54 may be connected through thermal vias 30 to a central heat spreader on the PCB 12.

FIGS. 3, 4, and 5 illustrate that any number of flip chip ECs may be provided under a single thermal lid or that separate thermal lids may be provided for each flip chip EC.

Figure 6:
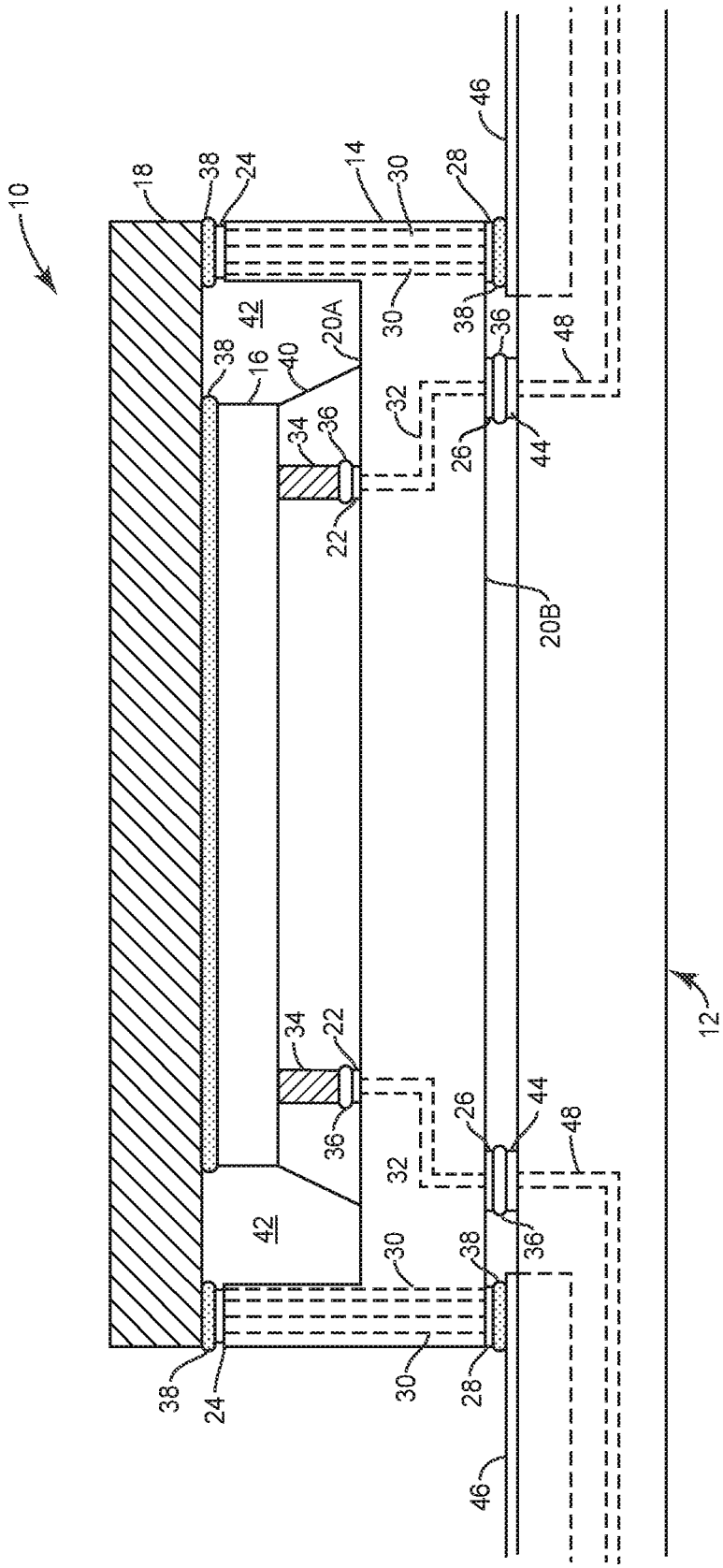
FIG. 6 is a cross-sectional view of an electronics package according to one embodiment of the present disclosure.

FIG. 6 shows the electronics package 10 according to an additional embodiment wherein the flip chip EC 16 is recessed in the substrate 14. In such an embodiment, a recess in the substrate 14 may be provided that is approximately the same height as the flip chip EC 16 such that the thermal lid 18 is provided over the recess as shown.

Figure 7:
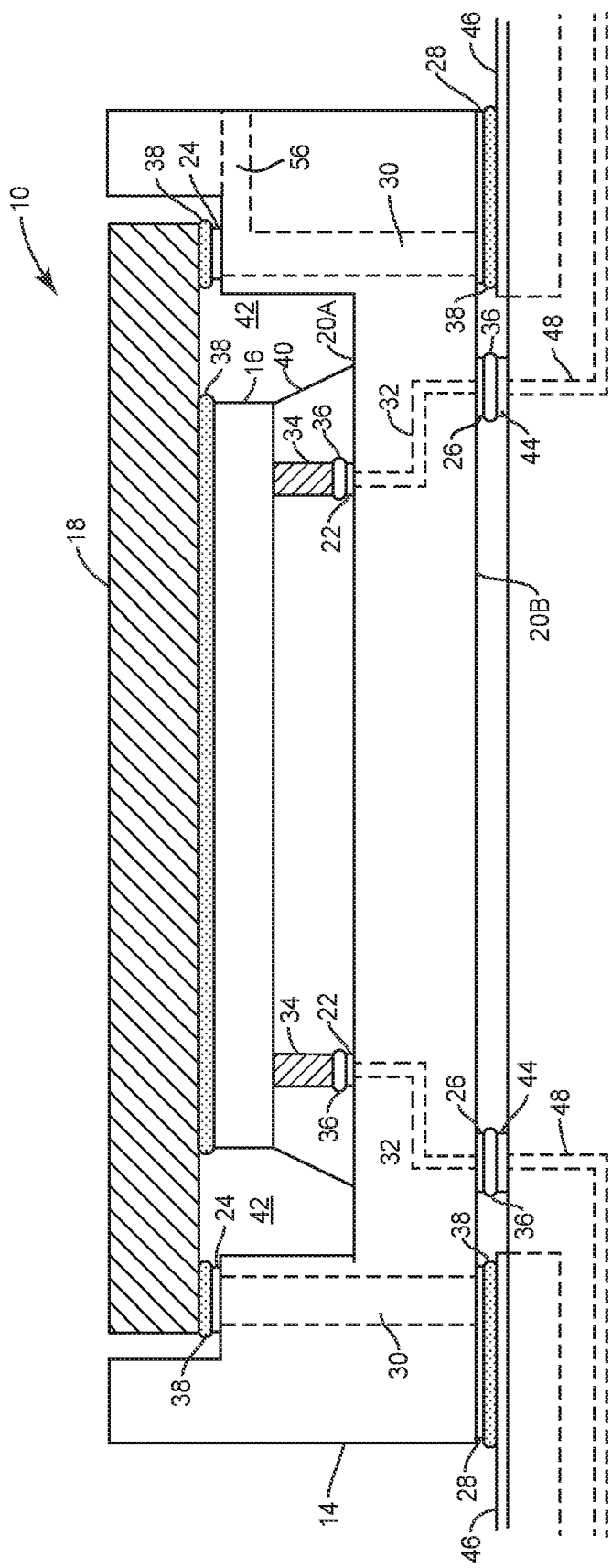
FIG. 7 is a cross-sectional view of an electronics package according to one embodiment of the present disclosure.

FIG. 7 shows the electronics package 10 according to an additional embodiment wherein the flip chip EC 16 and the thermal lid 18 are recessed in the substrate 14. In such an embodiment, a first recess in the substrate 14 may be provided that is approximately the same height as the flip chip EC 16 and a second recess in the substrate 14 may be provided that is approximately the same height as the thermal lid 18. The first recess may form a lip on which the thermal lid 18 is fixed and thermally in contact with the substrate 14. Thermal vias 30 along with one or more thermal plates 56 may be embedded in the substrate 14 so as to contact this lip in order to divert heat away from the thermal lid 18.

Figure 8:
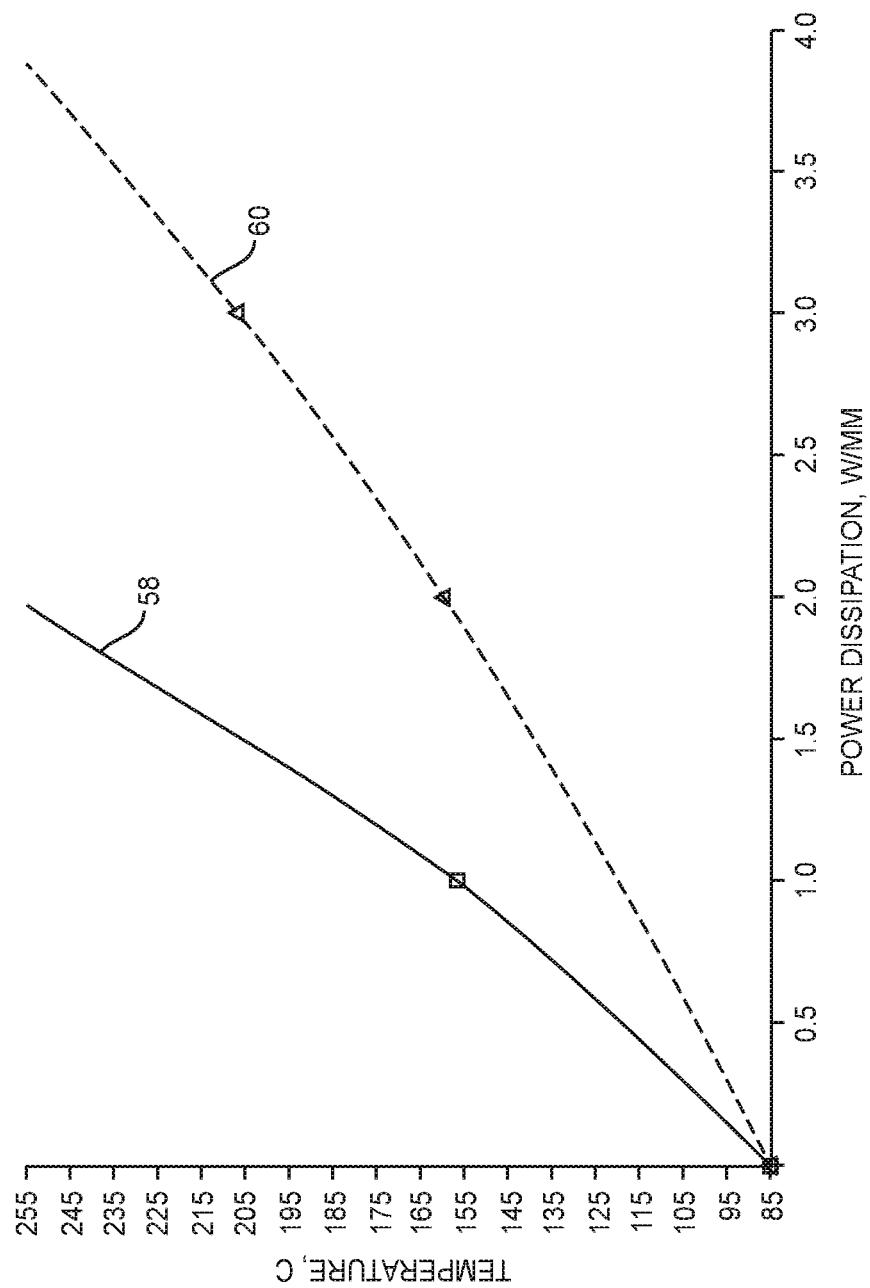
FIG. 8 is a graph illustrating the performance of an electronics package according to one embodiment of the present disclosure.

FIG. 8 is a graph illustrating the thermal performance of the electronics package 10 according to one embodiment of the present disclosure. A solid line 58 illustrates the thermal performance of a conventional flip chip EC with no thermal lid, while a dashed line 60 illustrates the thermal performance of a flip chip EC 16 in the electronics package 10 with the thermal lid 18 discussed above. As shown, the thermal performance of the flip chip EC 16 in the electronics package 10 is vastly superior to that of the conventional flip chip EC.

Those skilled in the art will recognize improvements and modifications to the preferred embodiments of the present disclosure. All such improvements and modifications are considered within the scope of the concepts disclosed herein and the claims that follow.

What is claimed is:

1. An electronics package comprising:
   a substrate;
   a first set of electronic contact pads on a first surface of the substrate;
   a first set of thermal contact pads on the first surface of the substrate;
   a second set of electronic contact pads on a second surface of the substrate opposite the first surface;
   a second set of thermal contact pads on the second surface of the substrate;
   a plurality of thermal vias in the substrate, each connecting one or more of the first set of thermal contact pads to one or more of the second set of thermal contact pads;
   a flip chip component coupled to the substrate via at least a portion of the first set of electronic contact pads; and
   a thermal lid over the flip chip component such that:
      the thermal lid is in contact with a surface of the flip chip component opposite the substrate; and
      the thermal lid is coupled to at least a portion of the first set of thermal contact pads;
   wherein the flip chip component and the thermal lid are recessed in the substrate.

2. The electronics package of claim 1 wherein:
   the second set of electronic contact pads is configured to be coupled to a corresponding set of electronic contact pads on a printed circuit board (PCB); and
   the second set of thermal contact pads is configured to be coupled to a corresponding set of thermal contact pads on the PCB.

3. The electronics package of claim 1 further comprising an additional flip chip component coupled to the substrate via at least a portion of the first set of electronic contact pads.

4. The electronics package of claim 3 further comprising an additional thermal lid over the additional flip chip component such that:
   the additional thermal lid is in contact with a surface of the additional flip chip component opposite the substrate; and
   the additional thermal lid is coupled to at least a portion of the first set of thermal contact pads.

5. The electronics package of claim 3 wherein the thermal lid is over the additional flip chip component such that the thermal lid is in contact with a surface of the additional flip chip component opposite the substrate.

6. The electronics package of claim 1 wherein the thermal lid provides a cavity in which the flip chip component is located.

7. The electronics package of claim 6 wherein the thermal lid encloses the flip chip component on at least two sides.

8. The electronics package of claim 7 wherein the thermal lid completely encloses the flip chip component.

9. The electronics package of claim 1 wherein the thermal lid comprises a metal.

10. The electronics package of claim 9 wherein the thermal lid is between 25 um and 1 mm thick.

11. The electronics package of claim 1 wherein the thermal lid is coupled to the surface of the flip chip component opposite the substrate via one of a thermal epoxy and a sintered material.

12. The electronics package of claim 11 wherein the thermal lid is coupled to the first set of thermal contact pads via one of a thermal epoxy and a sintered material.

13. The electronics package of claim 1 wherein the flip chip component is a copper pillar flip chip component.

14. An apparatus comprising:
    a printed circuit board (PCB);
    a plurality of PCB electronic contact pads on a surface of the PCB;
    a heat spreader on the surface of the PCB that spans out over an area of the surface away from the plurality of PCB electronic contact pads; and
    an electronics package (EP) comprising:
       a substrate;
       a first set of EP electronic contact pads on a first surface of the substrate;
       a first set of thermal contact pads on the first surface of the substrate;
       a second set of EP electronic contact pads on a second surface of the substrate opposite the first surface, each one of the second set of EP electronic contact pads coupled to a corresponding one of the plurality of PCB electronic contact pads;
       a second set of thermal contact pads on the second surface of the substrate, each one of the second set of thermal contact pads coupled to the heat spreader on the surface of the PCB;
       a plurality of thermal vias in the substrate, each connecting one or more of the first set of thermal contact pads to the second set of thermal contact pads;
       a flip chip component coupled to the substrate via at least a portion of the first set of EP electronic contact pads; and
       a thermal lid over the flip chip component such that:
          the thermal lid is in contact with a surface of the flip chip component opposite the substrate; and the thermal lid is coupled to at least a portion of the first set of thermal contact pads.

15. The apparatus of claim 14 wherein the heat spreader extends into the surface of the PCB such that the heat spreader is embedded in the PCB.

16. The apparatus of claim 14 further comprising one or more metallization layers each connecting one or more of the first set of EP electronic contact pads to one or more of the second set of EP electronic contact pads.

17. The apparatus of claim 14 wherein:
the thermal lid is coupled to the surface of the flip chip component opposite the substrate via one of a thermal epoxy and a sintered material; and
the thermal lid is coupled to the first set of thermal contact pads via one of a thermal epoxy and a sintered material.

18. The apparatus of claim 14 wherein the thermal lid comprises a metal.

19. The apparatus of claim 18 wherein the thermal lid is between 25 um and 1 mm thick.

20. The electronics package of claim 1 further comprising one or more metallization layers each connecting one or more of the first set of electronic contact pads to one or more of the second set of electronic contact pads, wherein the plurality of thermal vias are thicker in the substrate than the one or more metallization layers.

* * * * *